(12) United States Patent
Hviid

(10) Patent No.: US 6,522,538 B1
(45) Date of Patent: Feb. 18, 2003

(54) ELECTRONIC DEVICE EMC SHIELD WITH HELICAL SPRING

(75) Inventor: Erling Hviid, Kr. Saaby (DK)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/800,183

(22) Filed: Mar. 6, 2001

(51) Int. Cl.⁷ .................................................. H05K 7/20
(52) U.S. Cl. ..................... 361/690; 174/35 GS; 361/818
(58) Field of Search ............................... 174/35 GS, 67, 174/16.1; 454/184; 165/80.3; 312/236; 361/690, 692, 724, 726, 816, 818, 800

(56) References Cited

U.S. PATENT DOCUMENTS

| | | | | |
|---|---|---|---|---|
| 3,686,425 A | * | 8/1972 | Zerwes et al. ................. | 174/53 |
| 4,703,133 A | * | 10/1987 | Miller .................... | 174/35 GC |
| 4,900,877 A | * | 2/1990 | Dubrow et al. ........ | 174/35 GC |
| 5,539,620 A | * | 7/1996 | Gale et al. ................... | 361/800 |
| 5,746,326 A | * | 5/1998 | Hong ........................ | 211/41.17 |
| 6,011,700 A | * | 1/2000 | Matsuzaki ................... | 361/816 |
| 6,078,504 A | * | 6/2000 | Miles .......................... | 361/727 |
| 6,140,577 A | * | 10/2000 | Rapaich et al. ........... | 174/35 R |
| 6,188,014 B1 | * | 2/2001 | Richard et al. ........... | 174/35 R |

* cited by examiner

Primary Examiner—Gerald Tolin
(74) Attorney, Agent, or Firm—Schwegman, Lundberg, Woessner & Kluth, P.A.

(57) ABSTRACT

An electronic system enclosure has a first enclosure portion and a second enclosure portion such that the first enclosure portion is removably attachable to the second enclosure portion. A helical spring is mounted to the first enclosure portion and oriented such that the axis of the helical spring substantially follows and contacts the edge of the first enclosure portion, and such that the axis of the helical spring substantially follows and contacts the edge of the second enclosure when the first and second enclosure portions are attached.

15 Claims, 3 Drawing Sheets

ELECTRONIC DEVICE EMC SHIELD WITH HELICAL SPRING

FIELD OF THE INVENTION

The invention relates generally to electromagnetic shielding, and more specifically to an electromagnetic compatibility shielding system for electronic devices.

BACKGROUND OF THE INVENTION

Computerized systems and many other types of electronic devices contain circuits that carry signals changing at high speed. As the circuits operate and the state of the circuits change, the circuit may emit electromagnetic radiation. This radiated electromagnetic radiation may potentially interfere with other circuits or radio communication, and so standardized limits for electromagnetic radiation are enforced in the United States and many other countries.

Current generations of computer systems can include digital circuits operating at a clock rate of over one gigaHertz and dissipating over 150 watts of power, resulting in digital signals with significant energy. These digital signals have transition times significantly faster than the clock rate, and so will include substantial energy of much higher frequency than the system clock frequency. This electromagnetic radiation is typically contained by shielding the computer or other electronic device, such as by enclosing the components in a suitable case with electromagnetic shielding capability.

Such electronic device cases or enclosures usually comprise more than one part, such as an enclosure with a removable panel or lid to allow configuration or servicing of the electronic device. Ensuring proper shielding requires that any gaps in the enclosure be well sealed, with progressively smaller gaps being permissible as higher frequencies must be shielded. For example, the wavelength of an electromagnetic signal at 1 gHz is under one-third of a meter, and any 100 gHz energy present in the transitions of a 1 gHz digital signal is only a third of a centimeter in wavelength. To effectively shield signals with these short wavelengths, gaps with dimensions approaching the wavelength of the signals to be shielded must be filled or broken up.

While it is likely inevitable that some gaps will remain in enclosures used for shielding due to factors such as cooling and ventilating, external interfaces mounted in the enclosure, and imperfect sealing of the enclosure, it is desirable to reduce gaps in the enclosure to less than one-twentieth the wavelength of the highest frequency to be shielded.

Solutions to the enclosure sealing problem have traditionally included series of leaf springs that are forced into contact between an enclosure and a removable panel, use of semiflexible and conductive gaskets that are attached to either the removable panel or the enclosure, or use of punched indentations in either the enclosure or removable panel that are forced into contact as the panel seals. Each of these solutions has various advantages and disadvantages with respect to cost and effectiveness, but none of the solutions provide a solid electrical and mechanical contact with low impedance at a low material and labor costs.

What is needed is an improved electromagnetic shielding system providing a relatively inexpensive seal between elements of an enclosure that provides solid contact and a low impedance connection.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

A need exists for an improved electromagnetic shielding system providing a relatively inexpensive seal between elements of an enclosure that provides solid contact and a low impedance connection. The present invention addresses these needs in various embodiments by providing an electronic system enclosure having a first enclosure portion and a second enclosure portion such that the first enclosure portion is removably attachable to the second enclosure portion. A helical spring is mounted to the first enclosure portion and oriented such that the axis of the helical spring substantially follows and contacts the edge of the first enclosure portion, and such that the axis of the helical spring substantially follows and contacts the edge of the second enclosure when the first and second enclosure portions are attached.

Figure 1:
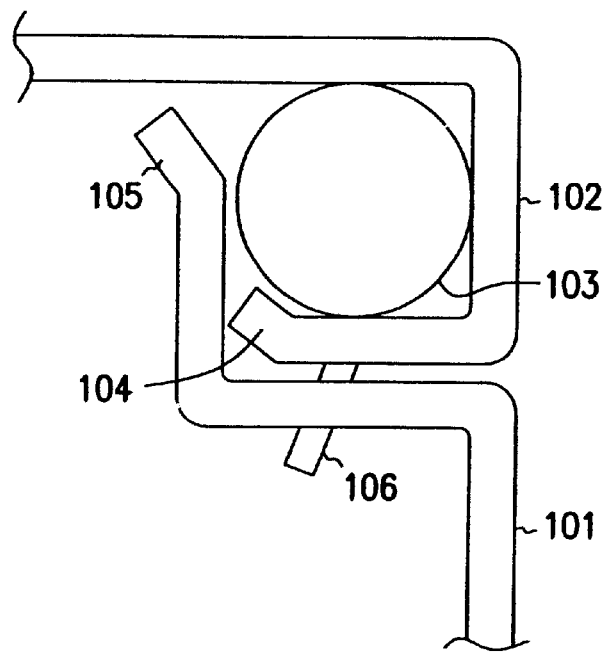
FIG. 1 is a cross-sectional view of a helical spring EMC shielded enclosure, consistent with an embodiment of the present invention.

FIG. 1 illustrates a cross-section of an example enclosure, consistent with the present invention. The enclosure 101 has a removable and attachable portion 102 that must be securely attached both electrically and mechanically to prevent electromagnetic interference from penetrating the sealed enclosure. This is achieved by use of helical spring 103 embedded within a channel of the removable enclosure portion 102, such as by crimping the spring in when bending the removable enclosure portion to shape. Tab 104 as shown in this embodiment of the invention serves to keep the spring contained within the removable enclosure portion's channel, and provides additional points of contact between the spring 103 and the removable enclosure portion 102. Tab 105 also serves to facilitate alignment and assembly of the enclosure 101 and removable enclosure portion 102.

The removable enclosure portion attaches to the enclosure 101 by aligning and positioning the removable portion 102 to mate with the chassis portion 101 as shown generally in FIG. 1. Features such as tab 106 are used in various embodiments to ensure proper alignment and mating of the enclosure portions, and further to secure the portions together. Various embodiments of the invention will further feature other systems of securing a removable portion of the enclosure to the chassis portion, as illustrated in the following example figures.

Figure 2:
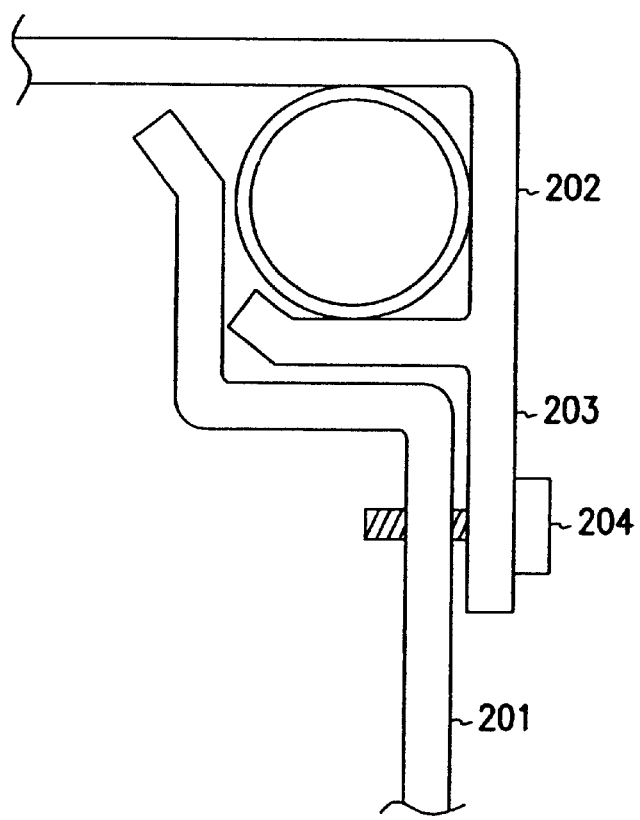
FIG. 2 shows a cross-sectional view of a helical spring EMC shielded enclosure featuring an alternate fastener, consistent with an embodiment of the present invention.

FIG. 2 shows one way in which a screw or other fastener may be used consistent with the present invention to secure the removable portion 202 to the chassis 201. A tab 203 extends from the removable portion 202 and is predrilled to accept a fastener, such as the sheet metal screw shown at 204. The screw 204 may in various embodiments be replaced with clips, bolts, tabs, other screws, or any other suitable fastener, and various embodiments will include fastening the chassis 201 to the removable portion 202 in various locations.

One embodiment of the invention particularly uses 0.8 mm sheet metal for the chassis and removable portions of the enclosure, which is preferably a metal that conducts both magnetic and electric fields. A 4mm diameter helical spring has been selected in this example embodiment as the spring to be captured by the removable enclosure portion, and is in a further embodiment made of stainless steel. The configuration of this embodiment has one edge of a square removable portion fitted with tabs, as is shown generally in FIG. 1, and the opposite edge of the square removable portion fitted with screws or other removable fasteners as shown and described in FIG. 2. To attach the removable portion of such an embodiment of the invention, the tabs are first aligned with slots in the chassis as shown in FIG. 1 and the lid is positioned in to place, and the fasteners are used as is shown in FIG. 2 to secure the removable portion to the chassis portion of the enclosure.

Figure 3:
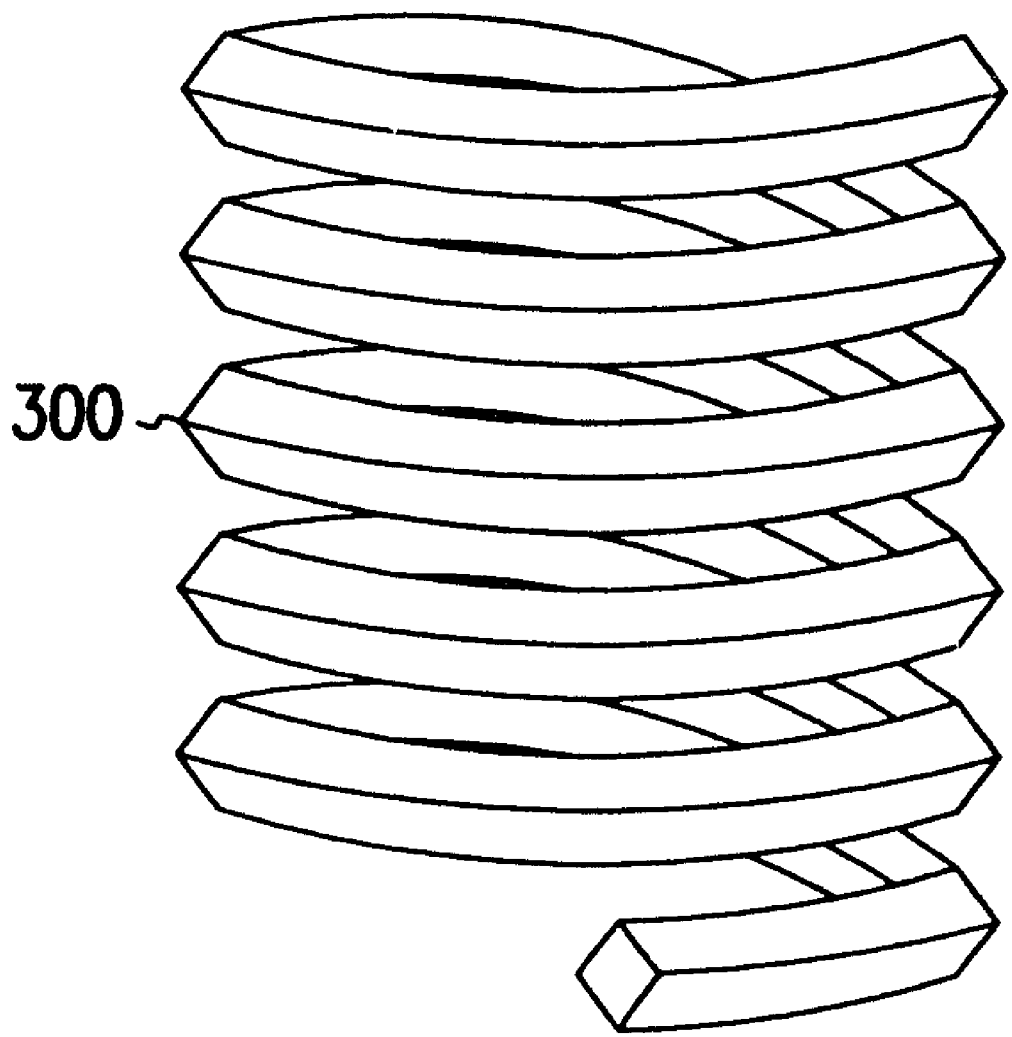
FIG. 3 shows a helical spring formed from square wire, consistent with an embodiment of the present invention.

Still further embodiments of the invention will feature other metals or materials for the chassis or removable enclosure portions of the enclosure such as conductive plastic or other material coated with ferromagnetic paint, and are within the scope of the invention. The helical spring may in various embodiments also be made of any suitable conductive material, and may in some embodiments be formed of material other than round steel. For example, a square steel wire may be used to form the helical spring as is shown generally in FIG. 3, such that the outside edges of the spring are sharp rather than rounded and better bite into the chassis and removable portions of the enclosure. The spring in such an embodiment of the invention will have the advantage of being better able to bite through oxidation or other contaminants on the enclosure or spring, and therefore provide a more reliable mechanical and electrical connection. Also, a helical spring for purposes of this application need not be perfectly cylindrical in form, but will in some embodiments have somewhat flattened sides where the spring contacts portions of the enclosure or have other variations in form.

Figure 4:
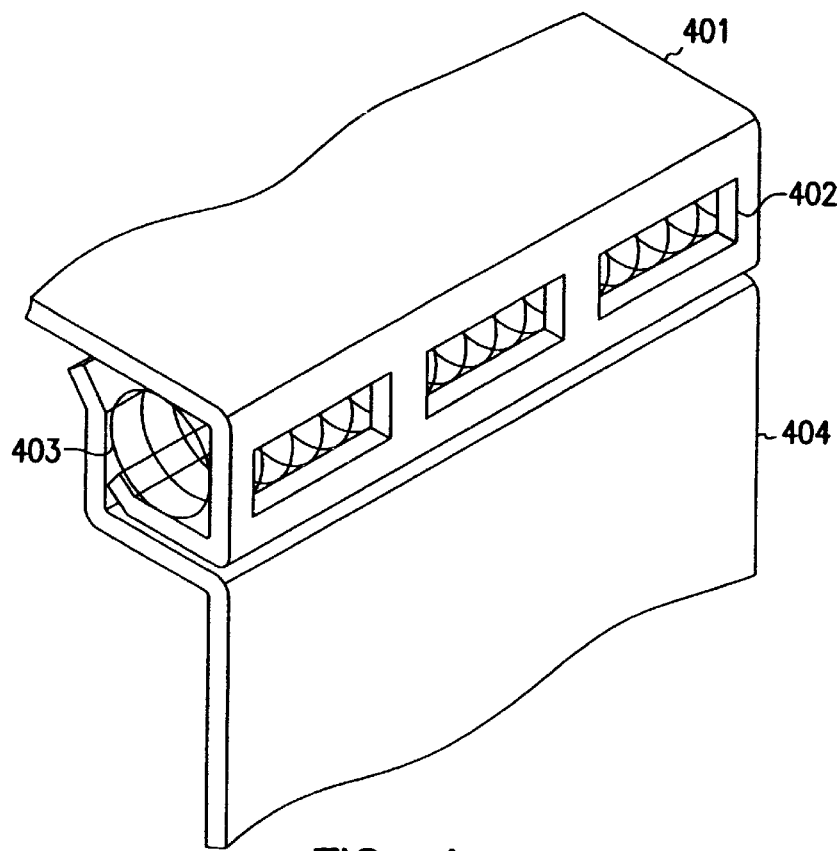
FIG. 4 shows a helical spring EMC shielded enclosure featuring ventilation slots in a removable enclosure portion, consistent with an embodiment of the present invention.
Figure 5:
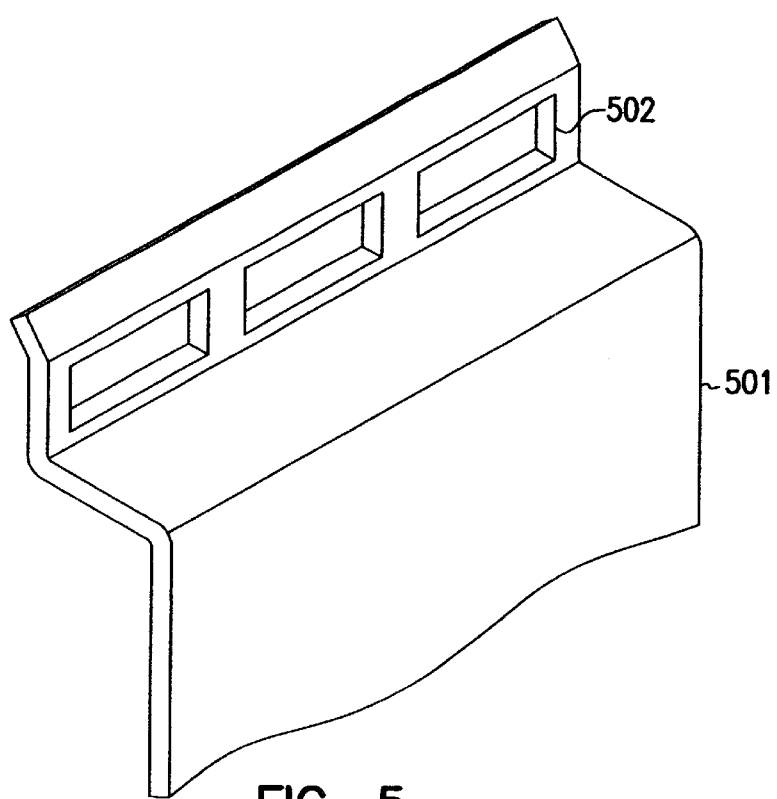
FIG. 5 shows a chassis portion of an EMC enclosure featuring slots that correspond to slots in the removable enclosure portion of FIG. 4, consistent with an embodiment of the present invention.

FIGS. 4 and 5 show an embodiment of the invention further incorporating ventilation holes or slots in portions of the chassis, and that provide airflow ventilation through the helical spring 403. The removable portion of the enclosure 401 has within it one or more slots 402, such that air can pass through the slots but such that the size of the opening through the slots to the interior of the enclosure is effectively limited by the helical spring 403. One or more corresponding ventilation slots are also located on the chassis portion of the enclosure 404, as shown in FIG. 5. In the embodiment pictured here, the slots 502 in the chassis portion 501 of the enclosure correspond to the slots 402 in the removable portion of the enclosure 401, facilitating relatively free airflow through the spring 403 when the enclosure is sealed.

The helical spring 403 performs the important function in such embodiments of reducing the apparent aperture size of the opening in the chassis from the actual size of the slots 402 to the size of the gap between coils of the helical spring. The helical spring therefore effectively increases the frequency to which the sealed enclosure acts as an effective electromagnetic shield.

It is anticipated that a variety of electromagnetically shielded enclosures may be designed consistent with the present invention but that vary substantially in configuration from the example embodiments shown here. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. An electronic system enclosure, comprising:
    a first external enclosure portion of the electronic system enclosure removably attachable to a second external enclosure portion of the electronic system enclosure;
    a helical spring mounted to the first external enclosure portion and having an axis, the helical spring oriented such that the axis of the helical spring is substantially parallel to an edge of the first external enclosure portion and the spring contacts the edge of the first external enclosure portion, and such that the axis of the helical spring is substantially parallel to an edge of the second external enclosure portion and the spring contacts the edge of the second external enclosure portion when the first and second external enclosure portions are attached.

2. The electronic system enclosure of claim 1, wherein the spring is formed of square wire such that the edges of the wire are oriented to penetrate the surface of the first and second enclosure portions when attached.

3. The electronic system enclosure of claim 1, wherein the helical spring is mounted in a channel comprising a part of the first external enclosure portion.

4. The electronic system enclosure of claim 3, wherein at least one of the first external enclosure portion and the second external enclosure portion are vented such that air may pass through the spring to ventilate the enclosure.

5. The electronic system enclosure of claim 1, wherein the first and second portions of the enclosure are attachable via tabs on one portion of the enclosure that mate with slots on another portion of the enclosure.

6. The electronic system enclosure of claim 1, wherein the first and second portions of the enclosure are attachable via screws that affix the first external portion of the enclosure to the second external portion.

7. An electronic system enclosure, comprising:
    a first external enclosure portion of the electronic system enclosure;
    a second external enclosure portion of the electronic system enclosure, the first external enclosure portion removably attachable to the second external enclosure portion;
    a helical spring mounted to the first external enclosure portion and having an axis, the helical spring oriented such that the axis of the helical spring is substantially parallel to an edge of the first external enclosure portion and the helical spring contacts the edge of the first external enclosure portion, and such that the axis of the helical spring is substantially parallel to an edge of the second external enclosure portion and the helical spring contacts the edge of the second external enclosure when the first and second external enclosure portions are attached.

8. The electronic system enclosure of claim 7, wherein the spring is formed of square wire such that the edges of the wire are oriented to penetrate the surface of the first and second external enclosure portions when attached.

9. The electronic system enclosure of claim 7, wherein the helical spring is mounted in a channel comprising a part of the first external enclosure portion.

10. The electronic system enclosure of claim 9, wherein at least one of the first external enclosure portion and the second external enclosure portion are vented such that air may pass through the spring to ventilate the enclosure.

11. The electronic system enclosure of claim 7, wherein the first and second external portions of the enclosure are attachable via tabs on one portion of the enclosure that mate with slots on another portion of the enclosure.

12. The electronic system enclosure of claim 7, wherein the first and second external portions of the enclosure are attachable via screws that affix the first external portion of the enclosure to the second external portion.

13. An electronic system enclosure electromagnetic shield, comprising:

a helical spring mounted to a first external enclosure portion of an electronic system enclosure and oriented such that the axis of the helical spring is substantially parallel to an edge of the first external enclosure portion and the helical spring contacts the edge of the first external enclosure portion; and such that the axis of the helical spring is substantially parallel to an edge of a second external enclosure portion of the electronic system enclosure and the helical spring contacts the edge of the second external enclosure portion when the first and second external enclosure portions are attached.

14. The electronic system enclosure electromagnetic shield of claim 13, wherein the spring is formed of square wire such that the edges of the wire are oriented to penetrate the surface of the first and second external enclosure portions when the first and second external enclosure portions are attached.

15. The electronic system enclosure electromagnetic shield of claim 13, wherein the helical spring is mounted in a channel comprising a part of the first external enclosure portion.

* * * * *